US012652861B2

(12) United States Patent
Bourgeat et al.

(10) Patent No.: US 12,652,861 B2
(45) Date of Patent: Jun. 9, 2026

(54) PROTECTION AGAINST ELECTROSTATIC DISCHARGES

(71) Applicant: STMicroelectronics France, Montrouge (FR)

(72) Inventors: Johan Bourgeat, Saint Pierre d'Allevard (FR); Yohann Solaro, Grenoble (FR)

(73) Assignee: STMicroelectronics France, Montrouge (FR)

( * ) Notice: Subject to any disclaimer, the term of this patent is extended or adjusted under 35 U.S.C. 154(b) by 366 days.

(21) Appl. No.: 18/231,928

(22) Filed: Aug. 9, 2023

(65) Prior Publication Data

US 2024/0072037 A1 Feb. 29, 2024

(30) Foreign Application Priority Data

Aug. 31, 2022 (FR) ........................................ 2208744

(51) Int. Cl.
H10D 89/60 (2025.01)
H10F 39/00 (2025.01)

(52) U.S. Cl.
CPC ......... H10D 89/611 (2025.01); H10D 89/911 (2025.01); H10D 89/931 (2025.01); H10F 39/809 (2025.01)

(58) Field of Classification Search
CPC .. H10D 89/611; H10D 89/911; H10D 89/931; H10D 87/00; H10D 89/60; H10F 39/809; H10F 39/802; H10F 39/807; H10F 39/18
See application file for complete search history.

(56) References Cited

U.S. PATENT DOCUMENTS 5,739,577 A * 4/1998 Tuttle ................... H10D 84/221
257/904
7,589,359 B1 * 9/2009 Hwang .................... H10D 8/80
257/107
10,861,847 B2 12/2020 Bairo
2008/0237783 A1 * 10/2008 Williams ........... H10D 84/0109
257/E29.174

(Continued)

OTHER PUBLICATIONS

INPI Search Report and Written Opinion for priority application, FR. Appl. 2208744, report datedMar. 28, 2023, 8 pgs.

*Primary Examiner* — Bitew A Dinke
(74) *Attorney, Agent, or Firm* — Crowe & Dunlevy LLC

(57) ABSTRACT

An electronic device includes a doped semiconductor substrate of a first conductivity type. A first doped well of a second conductivity type opposite to the first conductivity type extends into the doped semiconductor substrate from a surface thereof. A second doped well of the first conductivity type is located in the first well. A third electrically-insulating well is located in the second well. A fourth doped well of the first conductivity type is located in the third well. First, second, and third doped regions of the first conductivity type are respectively located in the doped semiconductor substrate, the second doped well and the fourth doped well. The first, second, and third doped regions have doping levels greater than a doping level of the doped semiconductor substrate. A fourth doped region the second conductivity type is located in the fourth doped well adjacent the second doped region.

20 Claims, 3 Drawing Sheets

(56)                    References Cited

U.S. PATENT DOCUMENTS

| | | | |
|---|---|---|---|
| 2012/0044178 A1* | 2/2012 | Song | G06F 3/0412 |
| | | | 345/173 |
| 2014/0376133 A1 | 12/2014 | Lin et al. | |
| 2015/0061023 A1* | 3/2015 | Solaro | H10D 30/021 |
| | | | 438/155 |
| 2015/0077888 A1* | 3/2015 | Galy | H10D 18/251 |
| | | | 361/56 |
| 2017/0330899 A1 | 11/2017 | Yuan et al. | |
| 2018/0062001 A1* | 3/2018 | Carobolante | H10D 1/045 |
| 2018/0102358 A1* | 4/2018 | Galy | H10D 64/62 |
| 2018/0182751 A1 | 6/2018 | Uchida et al. | |
| 2018/0315702 A1 | 11/2018 | Kawashima et al. | |
| 2019/0035945 A1* | 1/2019 | Li | H10D 62/115 |
| 2019/0341380 A1* | 11/2019 | Bairo | H10D 89/931 |
| 2020/0083212 A1* | 3/2020 | Zhao | H10D 62/142 |
| 2020/0194421 A1* | 6/2020 | Jack | H01L 21/761 |
| 2022/0270544 A1* | 8/2022 | Park | G09G 3/32 |

* cited by examiner

PROTECTION AGAINST ELECTROSTATIC DISCHARGES

PRIORITY CLAIM

This application claims the priority benefit of French Application for Patent No. 2208744, filed on Aug. 31, 2022, the content of which is hereby incorporated by reference in its entirety to the maximum extent allowable by law.

TECHNICAL FIELD

The present disclosure generally concerns electronic devices. The present disclosure more particularly concerns devices of protection of integrated circuits against electrostatic discharges.

BACKGROUND

A non-protected integrated circuit may undergo, in case of an electrostatic discharge, irreversible deteriorations likely to cause significant malfunctions of the circuit. To overcome this disadvantage, current integrated circuits are generally equipped with protections against electrostatic discharges.

There is a need to improve existing devices of protection of integrated circuits against electrostatic discharges.

It would in particular be desirable to form devices for protecting integrated circuits against electrostatic discharges which are compatible with circuit power supply voltages higher than several volts, or even than several tens of volts, and having a minimum bulk.

There is a need in the art to overcome all or part of the disadvantages of known devices of protection of integrated circuits against electrostatic discharges.

SUMMARY

An embodiment provides an electronic device comprising a doped semiconductor substrate of a first conductivity type and including, extending from a surface of the doped semiconductor substrate: a first doped well of a second conductivity type, opposite to the first conductivity type; a second doped well of the first conductivity type and located in the first doped well; a third electrically-insulating well located in the second doped well; a fourth doped well of the first conductivity type and located in the third electrically-insulating well; and first, second, and third doped regions of the first conductivity type and respectively located in the doped semiconductor substrate, in the second doped well, and in the fourth doped well.

According to an embodiment, the first and second doped regions each have, in top view, a ring shape surrounding the third region.

According to an embodiment, the first doped well has, in top view, a ring shape surrounding the second region.

According to an embodiment, the first and third doped regions are configured to be respectively connected to a first node of application of a reference potential, preferably the ground, and to a second node of application of a power supply potential.

According to an embodiment, the power supply potential is greater than 10 V, preferably greater than 20 V, more preferably equal to approximately 25 V.

According to an embodiment, the second doped region is configured to be left at a floating potential.

According to an embodiment, the device further comprises a first resistive element coupling the first doped region to the second doped region and a second resistive element coupling the second doped region to the third doped region.

According to an embodiment, the second resistive element has a resistance at least twice greater than that of the first resistive element.

According to an embodiment, the first doped well comprises vertical wells coating all the sides of the second doped well and a horizontal well coating a bottom of the second doped well opposite to said surface of the doped semiconductor substrate.

According to an embodiment, the third electrically-insulating well comprises an oxide layer vertically interposed between the second doped well and the fourth doped well and at least one insulating trench extending from said surface of the substrate to the oxide layer.

According to an embodiment, the first conductivity type is P and the second conductivity type is N.

An embodiment provides a device of protection against electrostatic discharges comprising at least one electronic device such as described.

An embodiment provides an image sensor comprising a protection device such as described and a plurality of pixels, each comprising at least one photosensitive diode.

According to an embodiment, the pixels are formed inside and on top of another semiconductor substrate located on top of and in contact with said surface.

BRIEF DESCRIPTION OF THE DRAWINGS

The foregoing and other features and advantages of the present invention will be discussed in detail in the following non-limiting description of specific embodiments in connection with the accompanying drawing, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the electronic components or the integrated circuits to be protected against electrostatic discharges are not detailed, the described embodiments being compatible with the components or circuits conventionally protected against electrostatic discharges.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1A:
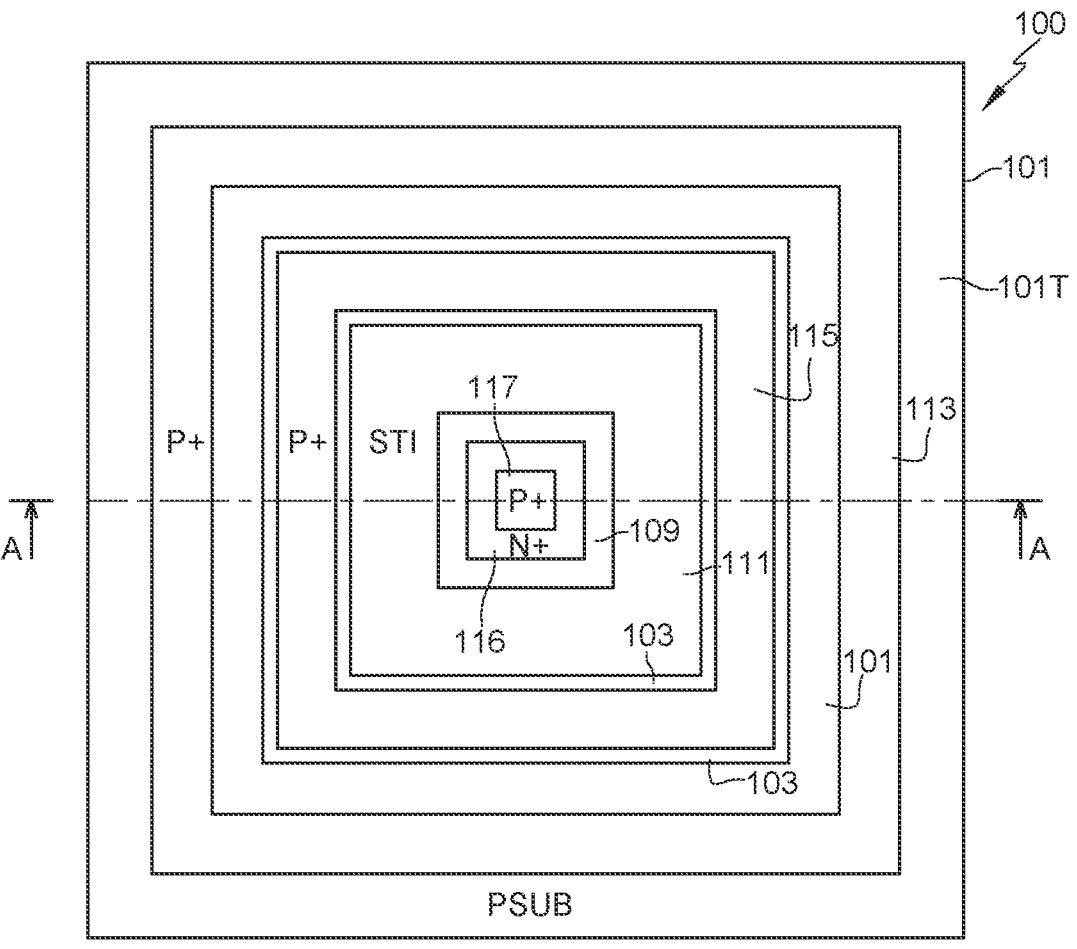
FIG. 1A is a partial simplified top view of an example of a device of protection against electrostatic discharges.
Figure 1B:
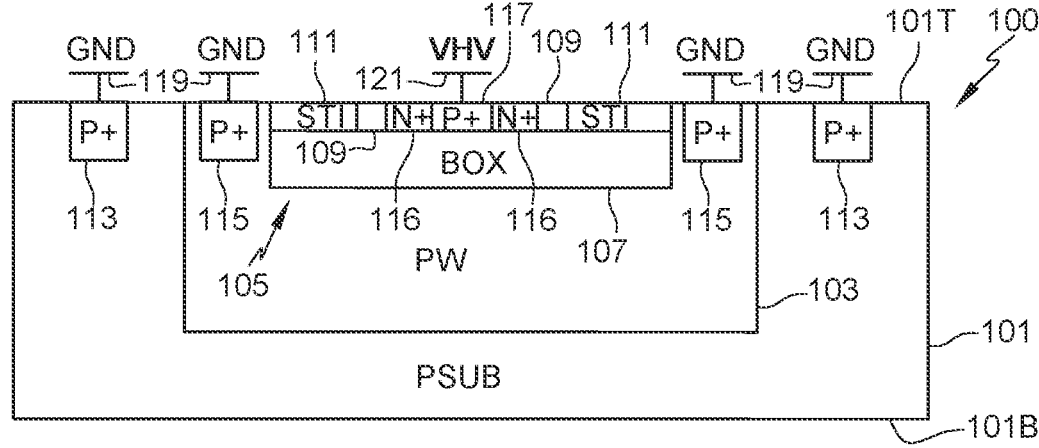
FIG. 1B is a cross-section view, along plane AA of FIG. 1A, of the device of FIG. 1A.

FIG. 1A is a partial simplified top view of an example of a device 100 of protection against electrostatic discharges. FIG. 1B is a cross-section view, along plane A-A of FIG. 1A, of the device 100 of FIG. 1A.

In the shown example, device 100 is formed in a semiconductor substrate 101 (PSUB). Substrate 101 is, for example, a wafer or a piece of wafer made of a semiconductor material, for example, silicon. As an example, substrate 101 is doped with a first conductivity type, for example, type P. To avoid overly complicating the drawing, a single device 100 has been illustrated in FIGS. 1A and 1i, it being understood that substrate 101 may in practice comprise any number of devices 100.

In the illustrated example, device 100 comprises a well 103 (PW), vertically extending into the thickness of semiconductor substrate 101 from a surface 101T of substrate 101 (the upper surface of substrate 101, in the orientation of FIG. 1). Well 103 has a height or depth, that is, a dimension measured along a direction orthogonal to surface 101T of substrate 101, smaller than the thickness of substrate 101. In other words, well 103 does not emerge on the side of a surface 101B of substrate 101 (the lower surface of substrate 101, in the orientation of FIG. 1B) opposite to surface 101T. The well 103 of device 100 is doped with the first conductivity type (type P, in this example) and has a doping level greater than that of substrate 101.

In the shown example, device 100 further comprises another well 105 extending vertically into the thickness of semiconductor substrate 101 from surface 101T of substrate 101. Well 105 is more precisely located inside of well 103 and has a height, or depth, smaller than that of well 103. In this example, well 103 coats all the sides, or lateral walls, and a surface of well 105 opposite to surface 101T (the bottom of well 105). The well 105 of device 100 is, for example, made of an electrically-insulating material, for example, an oxide, for example, silicon dioxide (SiO₂).

In this example, well 103 has, in top view, a ring shape surrounding well 105.

In the shown example, device 100 further comprises still another well 109 vertically extending into the thickness of semiconductor substrate 101 from surface 101T of substrate 101. Well 109 is more precisely located inside of insulating well 105 and has a height, or depth, smaller than that of well 105. In this example, well 105 coats all the sides, or lateral walls, and a surface of well 109 opposite to surface 101T (the bottom of well 109). Well 109 is, for example, doped with the first conductivity type (type P, in this example) and has a doping level substantially identical to that of substrate 101.

In the example illustrated in FIGS. 1A and 1B, insulating well 105 more precisely comprises an electrically-insulating layer 107 (BOX) horizontally extending under surface 101T of substrate 101 and separated from surface 101T by well 109. In this example, well 109 is interposed between electrically-insulating layer 107 and surface 101T of substrate 101. Layer 107 has a thickness in the range from 50 nm to 2 μm, for example equal to approximately 1.5 μm.

As an example, semiconductor substrate 101 is of silicon-on-insulator (SOI) type. An SOI substrate typically comprises a support layer made of a semiconductor material coated with another electrically-insulating layer, for example a buried oxide (BOX) layer, itself coated with still another layer made of a semiconductor material. In the case where substrate 101 is of SOI type, layer 107 corresponds, for example, to the electrically-insulating BOX layer and well 109 is, for example, formed in the semiconductor layer coating the insulating BOX layer.

In this example, well 105 further comprises an insulating trench 111 (STI) extending from surface 101T of substrate 101 to electrically-insulating layer 107. As an example, trench 111 is a shallow trench isolation (STI). In the example illustrated in FIGS. 1A and 1B, trench 111 has, in top view, a ring shape bordering, or delimiting, all the sides of well 109. More precisely, trench 111 coats all the sides of well 109.

In the shown example, device 100 further comprises doped regions 113 (P+), 115 (P+), 116 (N+), and 117 (P+) vertically extending into the thickness of semiconductor substrate 101 from surface 101T. Regions 113 and 115 are respectively located in substrate 101 and in well 103. Regions 116 and 117 are located in well 109.

In the shown example, region 113 has, in top view, a ring shape surrounding well 103. All the inner sides of region 113, that is, sides of region 113 located in front of region 115 are, in this example, separated from well 103 by a portion of substrate 101 more lightly doped than region 113. As a variant, region 113 may be electrically insulated from well 103 by a ring-shaped insulating trench surrounding well 103 and interposed between the inner sides of region 113 and well 103.

In the illustrated example, region 115 has, in top view, a ring shape surrounding well 105. In this example, all the outer sides of region 115, that is, the sides of region 115 located in front of region 113, are separated from substrate 101 by a portion of well 103 and all the inner sides of region 115, that is, the sides of region 115 located in front of region 117, are separated from well 105 by another portion of well 103. As a variant, region 115 may be electrically insulated from substrate 101 by a ring-shaped insulating trench surrounding region 115 and interposed between the outer sides of region 115 and substrate 101. Further, region 115 may be electrically insulated from well 105 by another ring-shaped insulating trench surrounding well 105 and interposed between the inner sides of region 115 and well 105.

In the shown example, the region 116 formed in well 109 is in contact, by one of its surfaces (the lower surface of region 116, in the orientation of FIG. 1), opposite to surface 101T of substrate 101, with the electrically-insulating layer 107 of well 105. In the illustrated example, region 116 has, in top view, a ring shape surrounding region 117. The outer sides of region 116 are separated from insulating trench 111 by portions of well 109 having a doping level for example substantially equal to that of substrate 101.

In the shown example, the region 117 formed in well 109 is in contact, by one of its surfaces (the lower surface of region 117, in the orientation of FIG. 1), opposite to surface 101T of substrate 101, with the electrically-insulating layer 107 of well 105. The sides of region 117 are, for example, in contact with the inner sides of region 116.

In the shown example, region 113 is located at the periphery of well 103, region 115 is located at the peripheral of well 105, and insulating trench 111 is located at the periphery of well 109. In this example, regions 113, 115, 116, and 117 are concentric, region 117 being surrounded with region 116, itself surrounded with region 115, region 115 being itself surrounded with region 113.

Regions 113, 115, and 117 are doped with the first conductivity type (type P, in this example) and each have a doping level greater than that of semiconductor substrate 101. Region 116 is doped with the second conductivity type (type N, in this example) and has a doping level greater than that of semiconductor substrate 101, for example substantially equal to that of regions 113, 115, and 117.

Regions 113 and 115 are, for example, configured to be connected to a node 119 of application of a reference potential, for example, the ground (GND). Region 116 is, for example, floating, that is, it is configured to be connected to no node of application of a potential. Region 117 is, for example, configured to be connected to a node 121 of application of a power supply potential (VHV).

Wells 103 and 105 as well as regions 113, 115, 116, and 117 are, for example, formed in substrate 101 by ion implantation from surface 101T of substrate 101.

For simplification, FIGS. 1A and 1B illustrate a case where only regions 116 and 117, respectively doped with the second and the first conductivity type, are formed in well 109. However, in practice, one or a plurality of other doped regions of the first and/or of the second conductivity type may further be formed in well 109. These regions may, in particular, be arranged to form one or a plurality of P-N junctions, for example, enabling to form one or a plurality of electronic components selected from among a diode, a triac, a thyristor, etc., preferably a triac or a thyristor. Generally, those skilled in the art are capable of providing, in the well 109 of device 100, the electronic component(s) adapted to or configured for the targeted application.

The nodes 119 and 121 of the device 100 of protection against electrostatic discharges of FIGS. 1A and 1B are, for example, configured to be connected to pads (not shown) of an integrated circuit. To be able to withstand the power supply potential VHV applied to node 121, the selected electronic component may be associated in series with one or a plurality of components of the same type or of different types.

In case of an electrostatic discharge on the side of node 121, potential VHV increases to cause an avalanche phenomenon within the component(s) comprised by device 100 in well 109. The current resulting from the discharge then crosses device 100, from node 121, and is drained off through node 119 of application of reference potential GND. In case of an electrostatic discharge on the side of node 119, device 100 has an operation similar to that previously described in the case of an electrostatic discharge on the side of node 121, with the difference that the current is then drained off from node 119 to node 121.

Generally, device 100 enables, in case of an electrostatic discharge on the side of node 121 of application of power supply potential VHV, to drain off electrons from region 117 to regions 113 and 115. This particularly enables to avoid for electrons to accumulate at node 121 under the effect of the electrostatic discharge, and thus to avoid causing irreversible damage to components or circuits connected between nodes 119 and 121. Device 100 further enables, in case of an electrostatic discharge on the side of node 119 of application of reference potential GND, to drain off electrons from regions 113 and 115 to region 117. This particularly enables to avoid for electrons to accumulate at node 119 under the effect of the electrostatic discharge, thus to avoid causing irreversible damage to components or circuits connected between nodes 119 and 121.

A disadvantage of device 100 lies in the fact that insulating well 105, and more precisely layer 107, has a breakdown voltage in the order of a few volts. This does not enable implementation of the device 100 in a case where potential VHV, applied to region 117 via node 121, is greater than some ten volts, for example equal to approximately 25 V. To overcome this disadvantage, an increase of the thickness of layer 107 could have been envisaged. This would however have caused an unwanted increase of the bulk of device 100 and a complication of the method of manufacturing device 100.

Figure 2A:
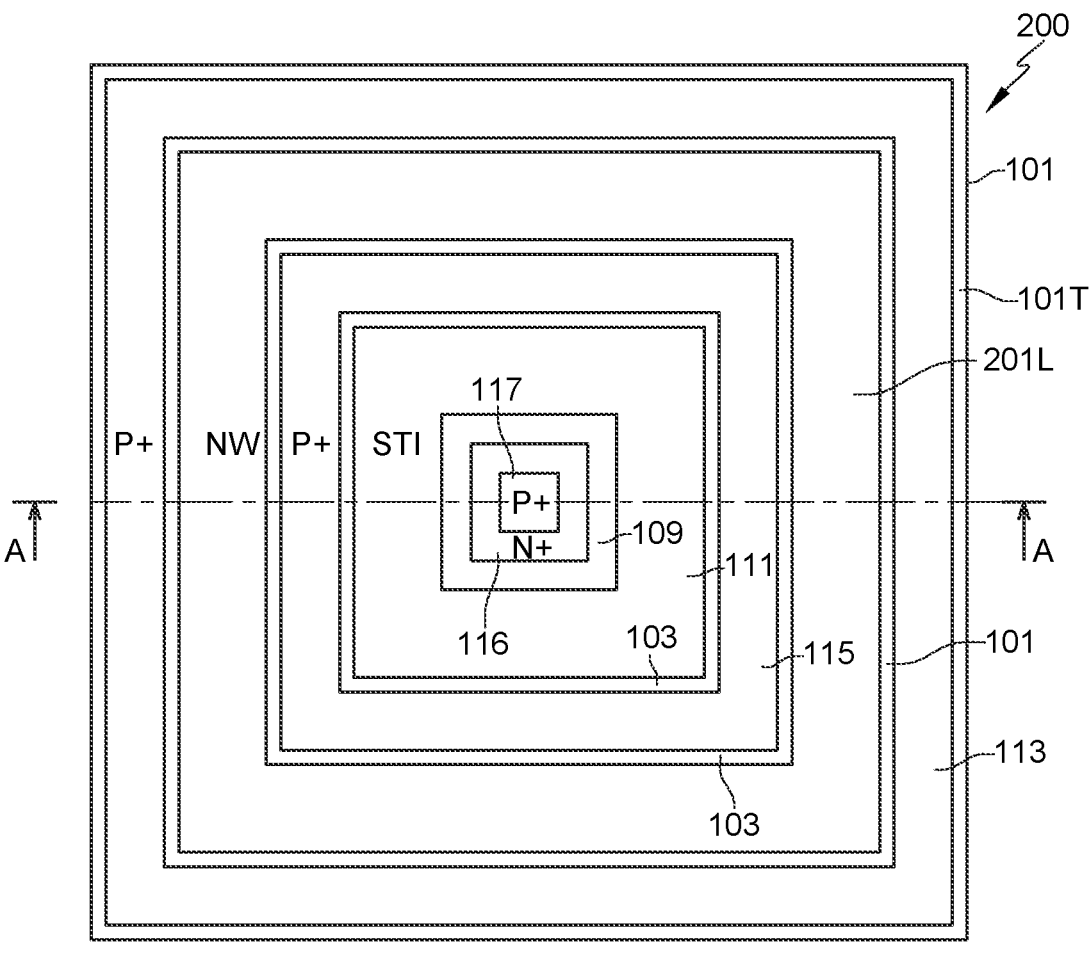
FIG. 2A is a partial simplified top view of a device of protection against electrostatic discharges according to a first embodiment.
Figure 2B:
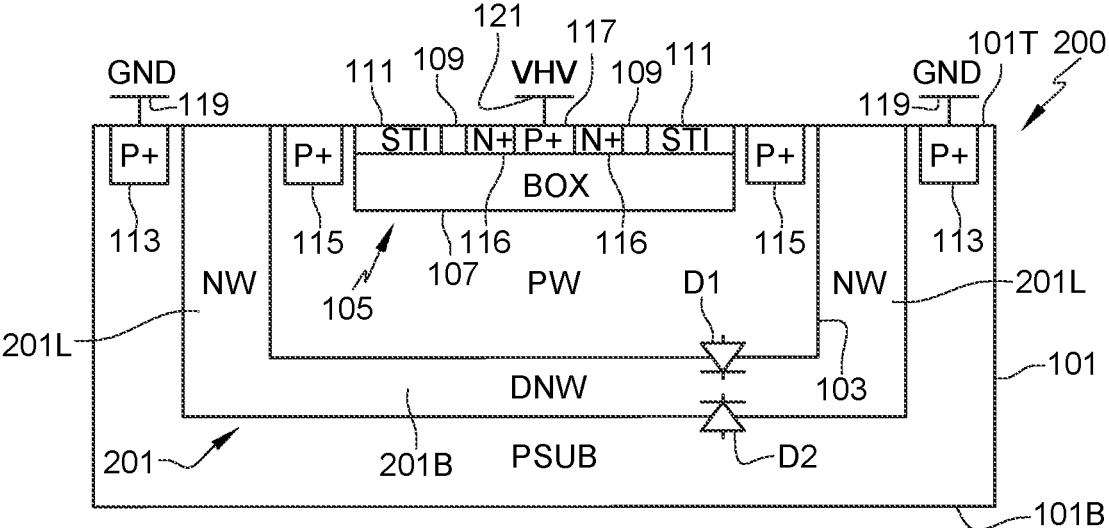
FIG. 2B is a cross-section view along plane AA of FIG. 2A, of the device of FIG. 2A.

FIG. 2A is a partial simplified top view of a device 200 of protection against electrostatic discharges according to a first embodiment. FIG. 2B is a cross-section view, along plane A-A of FIG. 2A, of the device 200 of FIG. 2A.

The device 200 of FIGS. 2A and 2B comprises elements common with the device 100 of FIGS. 1A and 1B. These common elements will not be detailed again hereafter. The device 200 of FIGS. 2A and 2B differs from the device 100 of FIGS. 1A and 1B in that device 200 further comprises another well 201.

According to an embodiment, well 201 extends vertically into the thickness of substrate 101 (PSUB) from surface 101T of substrate 101. Well 201 has a height smaller than the thickness of substrate 101. In other words, well 201 does not emerge on the side of the surface 101B of substrate 101 opposite to surface 101T. The well 201 of device 200 is doped with the second conductivity type (type N, in this example). In the shown example, well 201 has a ring shape surrounding doped well 103 (PW) of the first conductivity type (type P, in this example).

Well 201 integrally coats all the lateral surfaces and the surface of well 103 opposite to surface 101T (the bottom of well 103). More precisely, well 201 comprises lateral portions 201L (NW) coating the sides, or lateral walls, of well 103 and a lower portion 201B (DNW) coating the bottom of well 103. As an example, the lateral portions 201L of well 201 correspond to vertical wells and the lower portion 201B of well 201, which extends under and in contact with the underlying well 103, corresponds to a horizontal well, for example, a so-called deep well.

In the shown example, region 113 (P+) of device 200 has, in top view, a ring shape surrounding well 201. All the inner sides of region 113 are, in this example, separated from well 201 by a portion of substrate 101 more lightly doped than region 113. As a variant, region 113 may be electrically insulated from well 201 by a ring-shaped insulating trench surrounding well 201 and interposed between the inner sides of region 113 and well 201.

The insulating wells 105, 109 (formed by the STI and BOX) of device 200 are, for example, similar or identical to the wells 105 of 109 of device 100.

In this example, all the outer sides of region 115 (P+) are separated from well 201 by a portion of well 103. As a variant, region 115 may be electrically insulated from well 201 by a ring-shaped insulating trench surrounding region 115 and interposed between the outer sides of region 115 and well 201.

In device 200, the region 115 formed in well 103 is configured to be left at a floating potential. In other words, device 200 comprises no elements of application of a potential for biasing region 115, and thus well 103.

In device 200, wells 103 and 201 form a heterojunction symbolized, in FIG. 2B, by a diode D1. In the case where wells 103 and 201 are respectively P-type and N-type doped, diode D1 comprises an anode located on the side of well 103 and a cathode located on the side of well 201.

Further, in device 200, substrate 101 and well 201 form another heterojunction symbolized, in FIG. 2B, by another diode D2. In the case where substrate 101 and well 201 are respectively P-type and N-type doped, diode D2 comprises an anode located on the side of substrate 101 and a cathode located on the side of well 201. Diode D2 has a back voltage (BV), also called avalanche or breakdown voltage, enabling to electrically isolate region 117 from region 113.

Well 201 enables the device 200 of FIGS. 2A and 2B to have a back voltage, between substrate 101 and the region 117 formed in well 109, approximately twice greater than that of the device 100 of FIGS. 1A and 1B. Further, well 201 enables to submit electrically-insulating layer 107 (BOX) to an electric field less intense than in the case of device 100.

The presence of well 201, and more particularly of the heterojunction symbolized by diode D2, advantageously enables to make device 200 compatible with cases of use where the potential VHV applied to node 121 is greater than 10 V, preferably greater than 20 V, more preferably equal to approximately 25 V.

Figure 3:
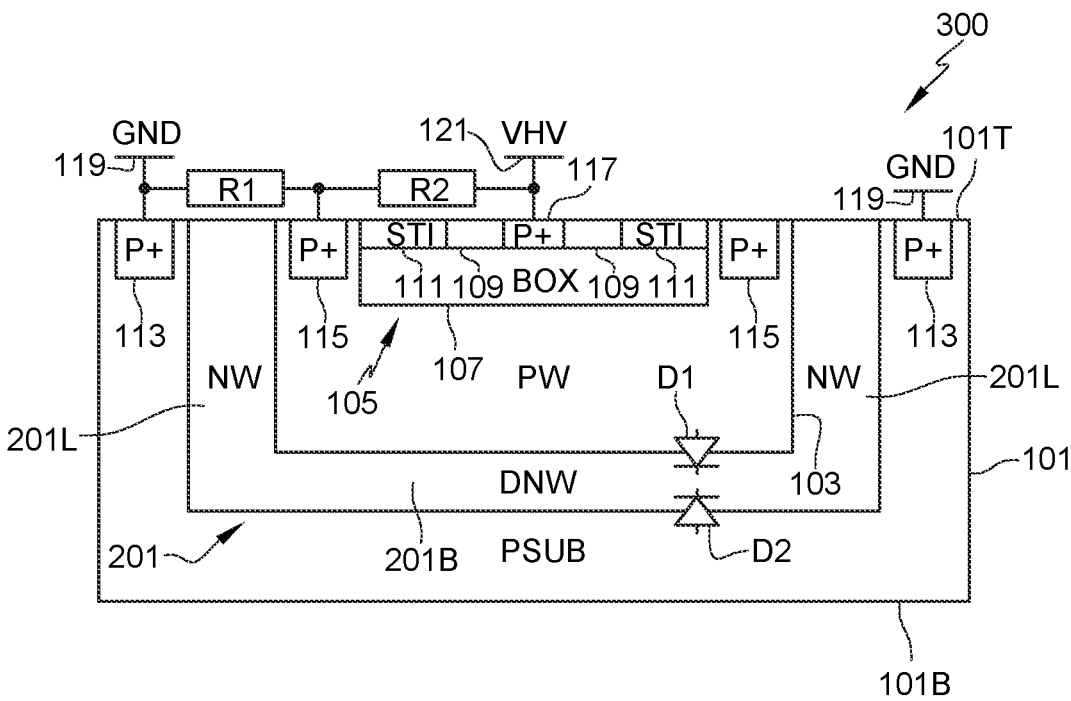
FIG. 3 is a partial simplified cross-section view of a device of protection against electrostatic discharges according to a second embodiment.

FIG. 3 is a partial simplified cross-section view of a device 300 of protection against electrostatic discharges according to a second embodiment. The device 300 of FIG. 3 comprises elements common with the device 200 of FIGS. 2A and 2B. These common elements will not be detailed again hereafter.

The device 300 of FIG. 3 differs from the device 200 of FIGS. 2A and 2B in that device 300 comprises a resistive element R1 coupling region 113 (P+) to region 115 (P+) and another resistive element R2 coupling region 115 to region 117 (P+). Resistive element R2 has a resistance approximately twice greater than that of resistive element R1. This enables to form a voltage dividing bridge applying, to region 115, a potential equal to approximately one third of the power supply potential VHV applied to region 117. As an example, resistive elements R1 and R2 are formed on substrate 101, on the side of surface 101T of substrate 101.

Device 300 has advantages similar to those of the device 200 of FIGS. 2A and 2B. The fact of providing resistive elements R1 and R2 advantageously enables to control the value of the potential applied to region 115, and thus to set the value of a bias potential of well 103 (PW).

Device 300 has, in top view and in cross-section view, a structure similar to that of the device 200 illustrated in FIGS. 2A and 2B.

Figure 4:
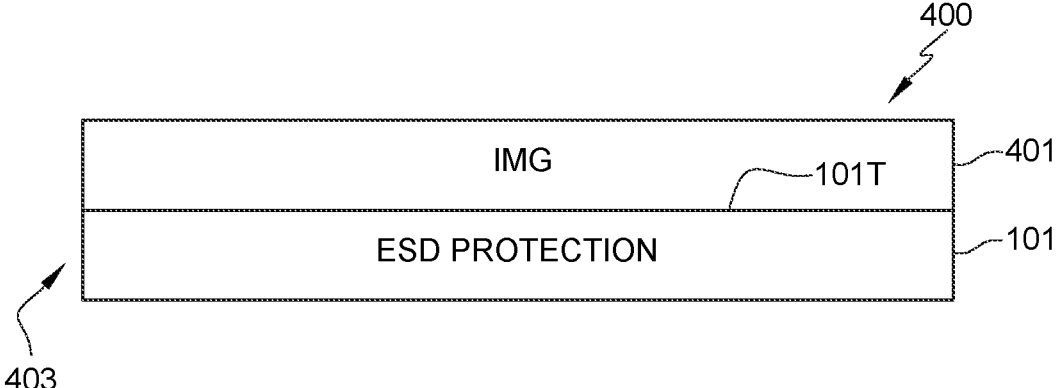
FIG. 4 is a partial simplified side view of an image sensor comprising a device of protection against electrostatic discharges.

FIG. 4 is a partial simplified side view of an image sensor 400.

In the shown example, image sensor 400 comprises a semiconductor substrate 401 (IMG) inside and on top of which are formed a plurality of pixels, not detailed in FIG. 4. Each pixel of sensor 400 comprises at least one photosensitive diode, or photodetector, for example of single-photon avalanche diode (SPAD) type. The pixels of image sensor 400 are, in the orientation of FIG. 4, configured to be illuminated from the upper surface of substrate 401.

In this example, sensor 400 further comprises semiconductor substrate 101 having a device 403 (ESD PROTEC-TION) of protection against electrostatic discharges formed therein. Protection device 403 comprises one or a plurality of unit devices of protection against electrostatic discharges of the type of the device 200 or of the device 300 previously described in relation with FIGS. 2A, 2B, and 3.

In the orientation of FIG. 4, substrate 401 is in contact, by its lower surface, with the upper surface 101T of the underlying substrate 101. As an example, substrates 101 and 401 are bonded by molecular bonding to obtain a three-dimensional, or 3D, structure.

As an example, a device 200 or 300 is coupled or connected to each photodetector, for example, each single-photon avalanche diode, of substrate 401. In this example, the photodetectors of image sensor 400 are powered with potential VHV and the devices 200 or 300 of device 403 enable to protect the photodetectors of substrate 401 against electrostatic discharges capable of occurring in sensor 400.

Various embodiments and variants have been described. Those skilled in the art will understand that certain features of these various embodiments and variants may be combined, and other variants will occur to those skilled in the art. In particular, although the case where the first conductivity type is P and the second conductivity type is N has been detailed hereabove, the described embodiments can be transposed by those skilled in the art to the case where the first conductivity type is N and the second conductivity type is P. In this case, potential VHV, applied to region 117 via node 121, should have a negative value, for example in the order of −25 V.

Further, although the regions 113, 115 and the insulating trench 111 of the devices 200 and 300 previously described in relation with FIGS. 2A, 2B, and 3 have, in top view, a ring shape, regions 113, 115 and insulating trench 111 may as a variant each have a different shape. As an example, regions 113, 115 and insulating trench 111 may each have, in top view, the shape of a strip laterally extending along a direction orthogonal to plane AA of FIG. 2A, or of a "U" having a horizontal bar which would extend along a direction orthogonal to the plane AA of FIG. 2A and having its vertical bars which would extend along directions parallel to plane AA and to surface 101T of substrate 100. In this case, regions 113, 115 and insulating trench 111 would for example be located on a same side of region 117, so that region 115 and insulating trench 111 are interposed between regions 113 and 117.

Finally, the practical implementation of the described embodiments and variants is within the abilities of those skilled in the art based on the functional indications given hereabove. In particular, those skilled in the art are capable of providing the doping levels of substrate 101, of wells 201, 103, 105, and 109 and of regions 113, 115, and 117. Further, those skilled in the art are capable of providing and of forming in well 109, in addition to region 117, one or a plurality of other doped regions of the first conductivity type and one or a plurality of doped regions of the second conductivity type to form at least one P-N junction.

The invention claimed is:

1. An electronic device, comprising:
a doped semiconductor substrate of a first conductivity type;
a first doped well of a second conductivity type opposite to the first conductivity type and extending into the doped semiconductor substrate from a surface of the doped semiconductor substrate;
a first doped region of the first conductivity type located in the doped semiconductor substrate, wherein the first doped region has a doping level greater than a doping level of the doped semiconductor substrate;
a second doped well of the first conductivity type located in the first doped well;
a second doped region of the first conductivity type located in the second doped well, wherein the second doped region has a doping level greater than the doping level of the doped semiconductor substrate;

a third electrically-insulating well located in the second doped well;

a fourth doped well of the first conductivity type located in the third electrically-insulating well and electrically isolated from the first and second doped wells; and a third doped region of the first conductivity type located in the fourth doped well, wherein the third doped region has a doping level greater than the doping level of the doped semiconductor substrate;

wherein the first doped region and the second doped region each have, in top view, a ring shape surrounding the third doped region.

2. The device according to claim 1, wherein the first doped well has, in top view, a ring shape surrounding the second doped region.

3. The device according to claim 1, wherein the first doped region is configured to be connected to a first node of application of a reference potential, and the third doped region is configured to be connected to a second node of application of a power supply potential.

4. The device according to claim 3, wherein the reference potential is ground and wherein the power supply potential is greater than 10 V.

5. The device according to claim 3, wherein the second doped region is configured to be left at a floating potential.

6. The device according to claim 1, wherein the first doped well comprises vertical wells coating all sides of the second doped well and a horizontal well coating a bottom of the second doped well opposite to said surface of the doped semiconductor substrate.

7. The device according to claim 1, wherein the third electrically-insulating well comprises an oxide layer vertically interposed between the second doped well and the fourth doped well and at least one insulating trench laterally interposed between the second doped well and the fourth doped well.

8. The device according to claim 1, wherein the first conductivity type is P and the second conductivity type is N.

9. The device according to claim 1, further comprising a fourth doped region of the second conductivity type located in the fourth doped well, wherein the fourth doped region has a doping level greater than the doping level of the doped semiconductor substrate.

10. The device according to claim 9, wherein the doping level of the fourth doped is substantially equal to the doping level of each of the first, second and third doped regions.

11. The device according to claim 9, wherein the fourth doped region has, in top view, a ring shape surrounding the third doped region.

12. The device according to claim 9, wherein the fourth doped region is in contact with the third doped region.

13. A device of protection against electrostatic discharges comprising at least one electronic device according to claim 1.

14. An image sensor, comprising:

a device according to claim 13; and a plurality of pixels, wherein each pixel comprises at least one photosensitive diode.

15. The sensor according to claim 14, wherein the pixels are formed inside and on top of another semiconductor substrate located on top of and in contact with said surface.

16. An electronic device, comprising:

a doped semiconductor substrate of a first conductivity type;

a first doped well of a second conductivity type opposite to the first conductivity type and extending into the doped semiconductor substrate from a surface of the doped semiconductor substrate;

a first doped region of the first conductivity type located in the doped semiconductor substrate, wherein the first doped region has a doping level greater than a doping level of the doped semiconductor substrate;

a second doped well of the first conductivity type located in the first doped well;

a second doped region of the first conductivity type located in the second doped well, wherein the second doped region has a doping level greater than the doping level of the doped semiconductor substrate;

a third electrically-insulating well located in the second doped well;

a fourth doped well of the first conductivity type located in the third electrically-insulating well and electrically isolated from the first and second doped wells;

a third doped region of the first conductivity type located in the fourth doped well, wherein the third doped region has a doping level greater than the doping level of the doped semiconductor substrate;

a first resistive element coupling the first doped region to the second doped region; and a second resistive element coupling the second doped region to the third doped region.

17. The device according to claim 16, wherein the second resistive element has a resistance approximately twice greater than a resistance of the first resistive element.

18. A device of protection against electrostatic discharges comprising at least one electronic device according to claim 16.

19. An image sensor, comprising:

a device according to claim 18; and a plurality of pixels, wherein each pixel comprises at least one photosensitive diode.

20. The sensor according to claim 19, wherein the pixels are formed inside and on top of another semiconductor substrate located on top of and in contact with said surface.

* * * * *